United States Patent
Murase

(10) Patent No.: US 11,979,137 B2
(45) Date of Patent: *May 7, 2024

(54) HIGH-FREQUENCY MODULE AND COMMUNICATION APPARATUS

(71) Applicant: Murata Manufacturing Co., Ltd., Kyoto (JP)

(72) Inventor: Hisanori Murase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 371 days.

This patent is subject to a terminal disclaimer.

(21) Appl. No.: 17/388,423

(22) Filed: Jul. 29, 2021

(65) Prior Publication Data

US 2021/0359661 A1 Nov. 18, 2021

Related U.S. Application Data

(63) Continuation of application No. PCT/JP2020/007439, filed on Feb. 25, 2020.

(30) Foreign Application Priority Data

Mar. 1, 2019 (JP) .................................. 2019-037228

(51) Int. Cl.
*H03H 9/05* (2006.01)
*H03F 1/56* (2006.01)
(Continued)

(52) U.S. Cl.
CPC ........... *H03H 9/0566* (2013.01); *H03F 1/565* (2013.01); *H03F 3/195* (2013.01); *H03F 3/245* (2013.01);
(Continued)

(58) Field of Classification Search
CPC .... H03H 9/0566; H03H 9/542; H03H 7/1766; H03F 1/565; H03F 3/195; H03F 3/245;
(Continued)

(56) References Cited

U.S. PATENT DOCUMENTS 7,183,619 B2  2/2007 Sugiura
9,780,735 B1  10/2017 Obiya et al.
(Continued)

FOREIGN PATENT DOCUMENTS

JP  2005057577 A  3/2005
JP  2005123909 A  5/2005
(Continued)

OTHER PUBLICATIONS

International Search Report issued in Application No. PCT/JP2020/007439, dated Apr. 7, 2020.
(Continued)

*Primary Examiner* — Andrea Lindgren Baltzell
*Assistant Examiner* — Kimberly E Glenn
(74) *Attorney, Agent, or Firm* — Pearne & Gordon LLP

(57) ABSTRACT

A high-frequency module (1) includes a mounting substrate (90), a duplexer (60L) arranged on the mounting substrate (90), a duplexer (60H) arranged on the mounting substrate (90) and having a pass band with a higher frequency than a pass band of the duplexer (60L), and a semiconductor control IC (40) arranged on the mounting substrate (90) and stacked with the duplexer (60L) of the duplexers (60L and 60H).

13 Claims, 5 Drawing Sheets

(51) Int. Cl.
*H03F 3/195* (2006.01)
*H03F 3/24* (2006.01)
*H03H 9/54* (2006.01)

(52) U.S. Cl.
CPC ....... *H03H 9/542* (2013.01); *H03F 2200/294* (2013.01); *H03F 2200/318* (2013.01); *H03F 2200/451* (2013.01)

(58) Field of Classification Search
CPC ......... H03F 2200/294; H03F 2200/318; H03F 2200/451; H04B 1/38
See application file for complete search history.

(56) References Cited

U.S. PATENT DOCUMENTS

| | | | | |
|---|---|---|---|---|
| 2001/0052830 A1* | 12/2001 | Noguchi | ................ | H03H 9/725 333/133 |
| 2005/0104685 A1 | 5/2005 | Kuroki et al. | | |
| 2017/0077896 A1* | 3/2017 | Sugaya | ................ | H03H 7/0138 |
| 2018/0190601 A1 | 7/2018 | Hitomi et al. | | |
| 2019/0267339 A1 | 8/2019 | Murase | | |
| 2021/0351802 A1* | 11/2021 | Murase | ................ | H03H 9/0547 |
| 2023/0240011 A1* | 7/2023 | Pham | .................... | H05K 1/181 361/609 |

FOREIGN PATENT DOCUMENTS

| | | |
|---|---|---|
| JP | 2017184060 A | 10/2017 |
| WO | 2017033564 A1 | 3/2017 |
| WO | 2018110513 A1 | 6/2018 |

OTHER PUBLICATIONS

Written Opinion issued in Application No. PCT/JP2020/007439, dated Apr. 7, 2020.

* cited by examiner

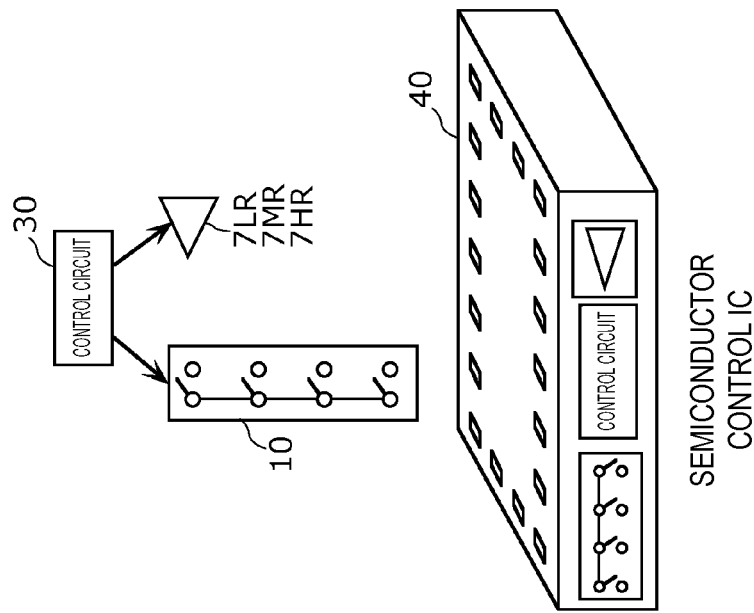
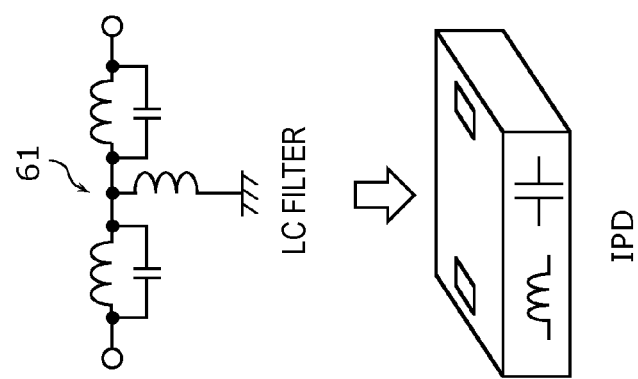
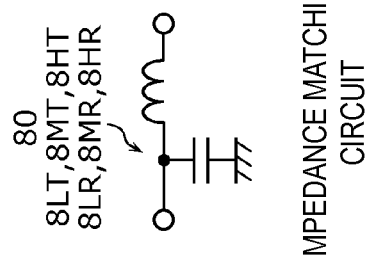

HIGH-FREQUENCY MODULE AND COMMUNICATION APPARATUS

CROSS REFERENCE TO RELATED APPLICATIONS

This is a continuation of International Application No. PCT/JP2020/007439 filed on Feb. 25, 2020 which claims priority from Japanese Patent Application No. 2019-037228 filed on Mar. 1, 2019. The contents of these applications are incorporated herein by reference in their entireties.

BACKGROUND OF THE DISCLOSURE

Field of the Disclosure

The present disclosure relates to a high-frequency module and a communication apparatus.

Description of the Related Art

In mobile communication apparatuses such as mobile phones, in particular, the number of circuit elements configuring a high-frequency front-end circuit increases with the progress in multi-band use.

Patent Document 1 discloses a surface acoustic wave device (high-frequency module) having a configuration in which a SAW device (high-frequency filter) and a semiconductor integrated circuit (semiconductor IC) are stacked in order to cope with the miniaturization of a high-frequency front-end circuit.

Patent Document 1: Japanese Unexamined Patent Application Publication No. 2005-57577

BRIEF SUMMARY OF THE DISCLOSURE

However, in the surface acoustic wave device (high-frequency module) disclosed in Patent Document 1, since the SAW device (high-frequency filter) and the semiconductor integrated circuit (semiconductor IC) are stacked, control characteristics of a control circuit included in the semiconductor integrated circuit (semiconductor IC) may deteriorate due to high-frequency noise oscillated from the high-frequency filter.

The present disclosure has been made in order to solve the above-described problems, and an object of the present disclosure is to provide a high-frequency module and a communication apparatus in which deterioration of control characteristics of a semiconductor control IC is suppressed.

In order to achieve the above object, a high-frequency module according to an aspect of the present disclosure includes a mounting substrate, a first filter arranged on the mounting substrate, a second filter arranged on the mounting substrate and having a pass band with a higher frequency than a pass band of the first filter, and a semiconductor control IC arranged on the mounting substrate and stacked with the first filter of the first filter and the second filter.

According to the present disclosure, it is possible to provide a high-frequency module and a communication apparatus in which deterioration of the control characteristics of a semiconductor control IC is suppressed.

BRIEF DESCRIPTION OF THE SEVERAL VIEWS OF THE DRAWINGS

FIGS. 2A, 2B and 2C include schematic diagrams illustrating a configuration of an integrated passive element and a semiconductor control IC according to the embodiment.

DETAILED DESCRIPTION OF THE DISCLOSURE

Figure 1:
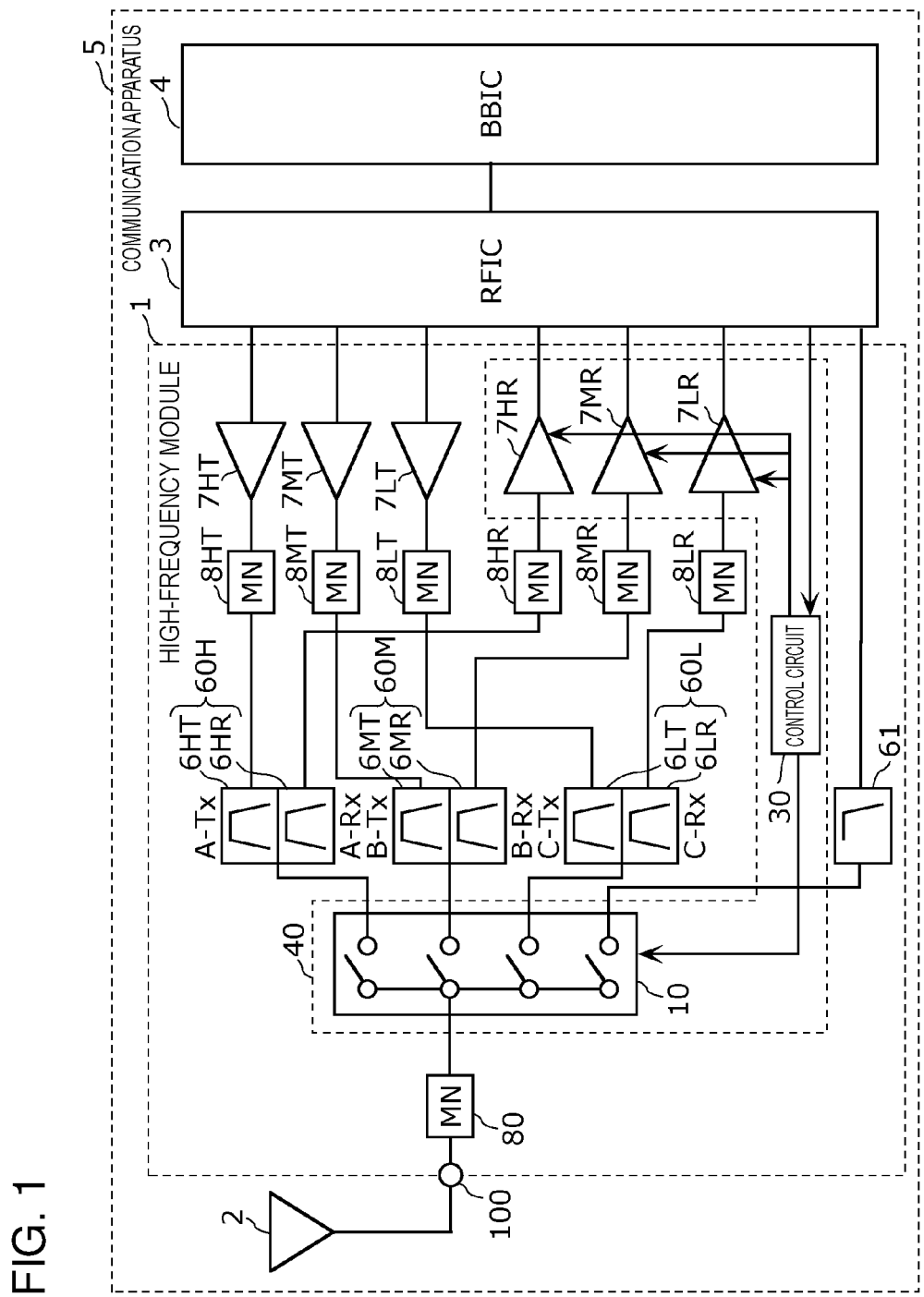
FIG. 1 is a circuit configuration diagram of a high-frequency module and a communication apparatus according to an embodiment.

Hereinafter, an embodiment of the present disclosure and modifications thereof will be described in detail with reference to the drawings. It should be noted that the embodiment described below and the modifications thereof are all inclusive or specific examples. The numerical values, shapes, materials, constituent elements, arrangement and connection forms of the constituent elements, and the like in the following embodiment and modifications thereof are mere examples, and are not intended to limit the present disclosure. Among the constituent elements in the following embodiment and modifications thereof, constituent elements not recited in the independent claims are described as arbitrary constituent elements. In addition, the size or a ratio of the size of the constituent elements illustrated in the drawings is not necessarily strict.

Note that in the following embodiment and modifications thereof, in A, B, and C mounted on a substrate, the expression "in a case where the substrate (or a main surface of the substrate) is viewed in a plan view, C is arranged between A and B" is defined to mean that a line connecting an arbitrary point in a region of A projected when the substrate is viewed in a plan view and an arbitrary point in a region of B projected when the substrate is viewed in a plan view is overlapped with at least a part of a region of C projected when the substrate is viewed in a plan view.

In addition, in the present specification, terms (e.g., "perpendicular", "parallel", and the like) that indicate relations between elements, terms that indicate the shapes of elements, and numerical ranges are not expressions that represent only strict meanings, but are expressions that are meant to include a substantially equivalent range, for example, even a difference of small percent.

Note that in the following embodiment and modifications thereof, "A and B are connected" is defined to include not only a fact that A and B are in contact with each other, but also a fact that A and B are electrically connected to each other via conductor wiring.

Embodiment

[1 Circuit Configuration of High-Frequency Module 1 and Communication Apparatus 5]

FIG. 1 is a circuit configuration diagram of a high-frequency module 1 and a communication apparatus 5 according to the embodiment. As illustrated in this figure, the communication apparatus 5 includes the high-frequency module 1, an antenna 2, an RF signal processing circuit (RFIC) 3, and a baseband signal processing circuit (BBIC) 4.

The RFIC 3 is an RF signal processing circuit that processes a high-frequency signal transmitted and received by the antenna 2. Specifically, the RFIC 3 performs signal processing on a high-frequency signal inputted through a reception signal path of the high-frequency module 1 by down-conversion or the like, and outputs a reception signal generated by the signal processing to the BBIC 4. Further, the RFIC 3 performs signal processing on a transmission signal inputted from the BBIC 4 by up-conversion or the like, and outputs a high-frequency signal generated by the signal processing to a transmission signal path of the high-frequency module 1.

The BBIC 4 is a circuit that performs signal processing using an intermediate frequency band with a lower frequency than a high-frequency signal transmitted through the high-frequency module 1. The signal processed in BBIC 4 is used, for example, as an image signal for image display, or used as an audio signal for a phone call via a speaker.

Further, the RFIC 3 has a function of controlling an inter-terminal connection of a switch 10 included in the high-frequency module 1 and a function of controlling gains of low-noise amplifiers (LNA) 7HR, 7MR, and 7LR included in the high-frequency module 1, on the basis of a communication band (frequency band) to be used. Specifically, the RFIC 3 outputs a power supply signal, an IO signal, a clock signal, a data signal, and the like to a control circuit 30 included in the high-frequency module 1. Based on these signals, the control circuit 30 outputs a control signal to the switch 10, and the low-noise amplifiers 7HR, 7MR, and 7LR.

The antenna 2 is connected to a transmission/reception terminal 100 of the high-frequency module 1, radiates a high-frequency signal outputted from the high-frequency module 1, and receives a high-frequency signal from the outside to output the high-frequency signal to the high-frequency module 1.

Note that, in the communication apparatus 5 according to the present embodiment, the antenna 2 and the BBIC 4 are not essential components.

Next, the detailed configuration of the high-frequency module 1 will be described.

As illustrated in FIG. 1, the high-frequency module 1 includes a transmission/reception terminal 100, duplexers 60H, 60M and 60L, an LC filter 61, a semiconductor control IC (Integrated Circuit) 40, matching circuits 8HT, 8MT, 8LT, 8HR, 8MR, 8LR, and 80, and power amplifiers (PA: Power Amplifier) 7HT, 7MT, and 7LT.

The duplexer 60H includes a transmission filter 6HT and a reception filter 6HR. The transmission filter 6HT is applied to a communication system according to the Third Generation Partnership Project (3GPP) standard, and for example, allows a high-frequency signal in a transmission band of a communication band A in Long Term Evolution (LTE) or 5th Generation New Radio (5GNR) to pass therethrough. The reception filter 6HR is applied to a communications system according to the 3GPP standard, and for example, allows a high-frequency signal in a reception band of the communication band A in LTE or 5GNR to pass therethrough.

The duplexer 60M includes a transmission filter 6MT and a reception filter 6MR. The transmission filter 6MT is applied to a communication system according to the 3GPP standard, and for example, allows a high-frequency signal in a transmission band of a communication band B in LTE or 5GNR to pass therethrough. The reception filter 6MR is applied to a communications system according to the 3GPP standard, and for example, allows a high-frequency signal in a reception band of the communication band B in LTE or 5GNR to pass therethrough.

The duplexer 60L includes a transmission filter 6LT and a reception filter 6LR. The transmission filter 6LT is applied to a communication system according to the 3GPP standard, and for example, allows a high-frequency signal in a transmission band of a communication band C in LTE or 5GNR to pass therethrough. The reception filter 6LR is applied to a communications system according to the 3GPP standard, and for example, allows a high-frequency signal in a reception band of the communication band C in LTE or 5GNR to pass therethrough.

Here, the communication band A has a higher frequency than that of the communication band B, and the communication band B has a higher frequency than that of the communication band C.

In the present embodiment, in two filters arbitrarily extracted out of the transmission filter and the reception filter configuring the duplexers 60H, 60M, and 60L, a filter having a pass band with a relatively low frequency is defined as a first filter, and a filter having a pass band with a relatively high frequency is defined as a second filter. Further, of the three filters arbitrarily extracted, a filter having a pass band with the highest frequency is defined as a second filter, and two filters having a pass band with a lower frequency than the second filter are defined as a first filter and a third filter.

Note that the transmission filters 6HT, 6MT, and 6LT and the reception filters 6HR, 6MR, and 6LR may be, for example, any one of a surface acoustic wave filter, an acoustic wave filter using a bulk acoustic wave (BAW), an LC resonant filter, and a dielectric filter, but they are not limited thereto.

The LC filter 61 is, for example, a low-pass filter circuit, and includes an inductor and a capacitor. The LC filter 61 allows, for example, a high-frequency signal in a transmission/reception band of a 2nd Generation (2G) communication band to pass therethrough.

The semiconductor control IC 40 includes the switch 10, the low-noise amplifiers 7HR, 7MR, and 7LR, and the control circuit 30.

The switch 10 has a common terminal and a plurality of selection terminals, and switches the connection and disconnection between the common terminal and each selection terminal. The common terminal of the switch 10 is connected to the transmission/reception terminal 100 via a matching circuit 80. The plurality of selection terminals of the switch 10 is connected to the common terminal of the duplexer 60H, the common terminal of the duplexer 60M, the common terminal of the duplexer 60L, and one terminal of the LC filter 61, respectively.

The low-noise amplifiers 7HR, 7MR, and 7LR each include an amplification element such as a bipolar transistor, a field effect transistor, or the like.

An input terminal of the low-noise amplifier 7HR is connected to an output terminal of the reception filter 6HR via the matching circuit 8HR, and an output terminal of the low-noise amplifier 7HR is connected to the RFIC 3. The low-noise amplifier 7HR preferentially amplifies the high-frequency signal in the communication band A with low noise, for example.

An input terminal of the low-noise amplifier 7MR is connected to an output terminal of the reception filter 6MR via the matching circuit 8MR, and an output terminal of the low-noise amplifier 7MR is connected to the RFIC 3. The low-noise amplifier 7MR preferentially amplifies the high-frequency signal in the communication band B with low noise, for example.

An input terminal of the low-noise amplifier 7LR is connected to an output terminal of the reception filter 6LR via the matching circuit 8LR, and an output terminal of the low-noise amplifier 7LR is connected to the RFIC 3. The low-noise amplifier 7LR preferentially amplifies the high-frequency signal in the communication band C with low noise, for example.

Note that the low-noise amplifiers 7HR, 7MR, and 7LR may be collected on one amplification circuit. In this case, the amplification circuit preferentially amplifies the high-frequency signals of the communication bands A, B, and C with low noise, and a switch that switches the connection and disconnection between the reception filters 6HR, 6MR, and 6LR and an input terminal of the amplification circuit is arranged on the side of the input terminal of the amplification circuit.

The semiconductor control IC 40 is made of, for example, a complementary metal oxide semiconductor (CMOS). This makes it possible to manufacture the semiconductor control IC 40 at low cost. Note that the semiconductor control IC 40 may be made of GaAs. This makes it possible to output a high-frequency signal having high-quality amplification performance and noise performance.

Further, the switch 10 and the low-noise amplifiers 7HR, 7MR, and 7LR may not be included in the semiconductor control IC 40. The switch 10 may be arranged individually, for example, as a component separate from the semiconductor control IC 40. Further, the low-noise amplifiers 7HR, 7MR, and 7LR may be arranged individually, for example, as an amplification circuit separate from the semiconductor control IC 40.

The power amplifiers 7HT, 7MT, and 7LT each include an amplification element, such as a bipolar transistor or a field effect transistor. The power amplifiers 7HT, 7MT, and 7LT are configured of, for example, a CMOS or a field-effect transistor (FET) made of GaAs, a heterojunction bipolar transistor (HBT), and the like.

An input terminal of the power amplifier 7HT is connected to the RFIC 3. An output terminal of the power amplifier 7HT is connected to an input terminal of the transmission filter 6HT via the matching circuit 8HT. The power amplifier 7HT preferentially amplifies the high-frequency signal in the communication band A, for example.

An input terminal of the power amplifier 7MT is connected to the RFIC 3. An output terminal of the power amplifier 7MT is connected to an input terminal of the transmission filter 6MT via the matching circuit 8MT. The power amplifier 7MT preferentially amplifies the high-frequency signal in the communication band B, for example.

An input terminal of the power amplifier 7LT is connected to the RFIC 3. An output terminal of the power amplifier 7LT is connected to an input terminal of the transmission filter 6LT via the matching circuit 8LT. The power amplifier 7LT preferentially amplifies the high-frequency signal in the communication band C, for example.

Note that the power amplifiers 7HT, 7MT, and 7LT may be collected on one amplification circuit. In this case, the amplification circuit preferentially amplifies the high-frequency signals in the communication bands A, B, and C, and a switch that switches the connection and disconnection between the transmission filters 6HT, 6MT, and 6LT and an output terminal of the amplification circuit is arranged on the side of the output terminal of the amplification circuit.

Further, the semiconductor control IC 40 may further include the power amplifiers 7HT, 7MT, and 7LT and an amplification control circuit for controlling gains of these power amplifiers.

That is, the semiconductor control IC 40 may include at least one of: (1) the switch 10 and a switch control circuit that controls the switching of the switch 10; and (2) an amplifier that amplifies a high-frequency signal and an amplification control circuit that controls a gain of the amplifier.

The matching circuit 8HT is arranged in a path connecting the power amplifier 7HT and the transmission filter 6HT, and matches an output impedance of the power amplifier 7HT with an input impedance of the transmission filter 6HT. The matching circuit 8MT is arranged in a path connecting the power amplifier 7MT and the transmission filter 6MT, and matches an output impedance of the power amplifier 7MT with an input impedance of the transmission filter 6MT. The matching circuit 8LT is arranged in a path connecting the power amplifier 7LT and the transmission filter 6LT, and matches an output impedance of the power amplifier 7LT with an input impedance of the transmission filter 6LT. Each of the matching circuits 8HT, 8MT, and 8LT includes at least one of an inductor and a capacitor.

The matching circuit 8HR is arranged in a path connecting the low-noise amplifier 7HR and the reception filter 6HR, and matches an input impedance of the low-noise amplifier 7HR with an output impedance of the reception filter 6HR. The matching circuit 8MR is arranged in a path connecting the low-noise amplifier 7MR and the reception filter 6MR, and matches an input impedance of the low-noise amplifier 7MR with an output impedance of the reception filter 6MR. The matching circuit 8LR is arranged in a path connecting the low-noise amplifier 7LR and the reception filter 6LR, and matches an input impedance of the low-noise amplifier 7LR with an output impedance of the reception filter 6LR. Each of the matching circuits 8HR, 8MR, and 8LR includes at least one of an inductor and a capacitor.

The matching circuit 80 is arranged in a path connecting the switch 10 and the transmission/reception terminal 100, and establishes impedance matching between the switches 10 and the duplexers 60H, 60M, and 60L and the antenna 2. The matching circuit 80 includes at least one of an inductor and a capacitor.

According to the above-described circuit configuration of the high-frequency module 1, it is possible to perform any one of transmission and reception of a high-frequency signal in the communication band A, transmission and reception of a high-frequency signal in the communication band B, transmission and reception of a high-frequency signal in the communication band C, and transmission and reception of a high-frequency signal of 2G. Further, according to the above-described circuit configuration, two or more of the transmission and reception of the high-frequency signal in the communication band A, the transmission and reception of the high-frequency signal in the communication band B, the transmission and reception of the high-frequency signal in the communication band C, and the transmission and reception of the high-frequency signal of 2G can be performed at the same time.

Note that the high-frequency module according to the present disclosure only needs to include at least two of the duplexers 60H, 60M, and 60L, and at least the semiconductor control IC 40 among the components of the high-frequency module 1 according to the embodiment. Further, each of the duplexers 60H, 60M and 60L may be only one of the transmission filter and the reception filter. That is, the duplexers 60H, 60M, and 60L may be each a single filter having the communication band A as a pass band, a single filter having the communication band B as a pass band, and a single filter having a communication band C as a pass band.

Therefore, the number of communication bands in which the high-frequency module according to the present disclosure can perform transmission only needs to be two or more, and the presence or absence of simultaneous transmission of transmission signals and reception signals in the same communication band and the presence or absence of simultaneous transmission of signals between different communication bands are also optional.

Here, in a case where the circuit elements (and components) that configure the high-frequency module 1 are made by one module as a compact front-end circuit, a mounting area on the mounting substrate may be reduced by stacking the circuit elements with each other. However, for example, when the duplexers 60H, 60M, and 60L and the semiconductor control IC 40 are stacked, the control characteristics of the semiconductor control IC 40 may deteriorate due to a high-frequency noise oscillated from the duplexers 60H, 60M, and 60L.

On the other hand, since a signal having a high frequency easily propagates in the space and is likely to be a noise signal, the high-frequency module 1 according to the present embodiment has a configuration in which a stack of a duplexer for processing a signal having a relatively high frequency and the semiconductor control IC 40 is excluded. Hereinafter, a configuration in which the deterioration of the control characteristics of the semiconductor control IC is suppressed while reducing the size of the high-frequency module 1 will be described.

[2 Circuit Element Arrangement Configuration of High-Frequency Module 1]

FIGS. 2A, 2B and 2C include schematic diagrams illustrating the configuration of an integrated passive element (IPD) and the semiconductor control IC 40 according to the embodiment.

As illustrated in FIG. 2C, in the semiconductor control IC 40 according to the present embodiment, the switch 10, the low-noise amplifiers 7HR, 7MR, and 7LR, and the control circuit 30 are formed into one chip (one package).

Further, as illustrated in FIG. 2A, each of the matching circuits 8HT, 8MT, 8LT, 8HR, 8MR, 8LR, and 80 according to the present embodiment is a first integrated passive element (first IPD) having a configuration in which passive elements, such as an inductor and a capacitor, are integrally mounted inside or on a surface of the substrate. The substrate configuring the first integrated passive element (first IPD) is, for example, a Si substrate. The first integrated passive element (first IPD) is formed into one chip.

Further, as illustrated in FIG. 2B, the LC filter 61 according to the present embodiment is a second integrated passive element (second IPD) having a configuration in which passive elements, such as an inductor and a capacitor, are integrally mounted inside or on the surface of the substrate. The substrate configuring the second integrated passive element (second IPD) is, for example, a Si substrate. The second integrated passive element (second IPD) is formed into one chip.

Figure 3:
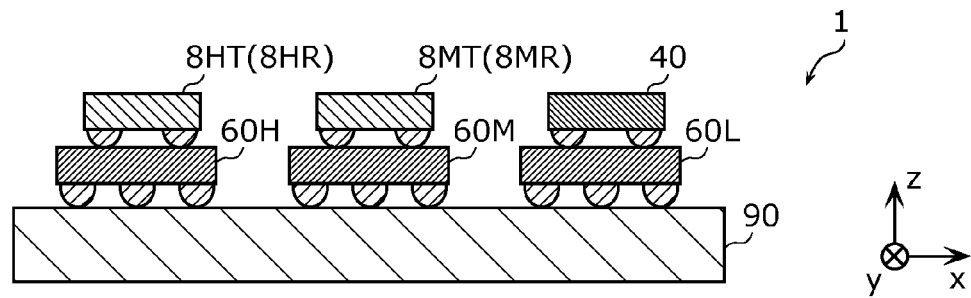
FIG. 3 is a schematic cross-sectional view of the high-frequency module according to the embodiment.

FIG. 3 is a schematic cross-sectional view of the high-frequency module 1 according to the embodiment. As illustrated in this figure, the high-frequency module 1 according to the present embodiment further includes a mounting substrate 90 in addition to the circuit configuration illustrated in FIG. 1. Note that, FIG. 3 illustrates the duplexers 60H, 60M, 60L, at least one of the matching circuits 8HT and 8HR (hereinafter described as the matching circuit 8HT (8HR)), at least one of 8MT and 8MR (hereinafter described as the matching circuit 8MT (8MR)), and the semiconductor control IC 40 among the circuit configurations illustrated in FIG. 1.

The mounting substrate 90 is a substrate on which a circuit element and a component configuring the high-frequency module 1 are mounted. As the mounting substrate 90, for example, a low-temperature co-fired ceramics (LTCC) substrate having a laminated structure of a plurality of dielectric layers, a printed circuit board, or the like is used.

As illustrated in FIG. 3, the duplexer 60L and the semiconductor control IC 40 are stacked in a direction (z-axis direction) perpendicular to a main surface of the mounting substrate 90. Further, the duplexer 60M and the matching circuit 8MT (8MR) are stacked in a direction (z-axis direction) perpendicular to the main surface of the mounting substrate 90. In addition, the duplexer 60H and the matching circuit 8HT (8HR) are stacked in a direction (z-axis direction) perpendicular to the main surface of the mounting substrate 90.

That is, in the high-frequency module 1 according to the present embodiment, the semiconductor control IC 40 is stacked with the duplexer 60L of the duplexer 60H configured by the transmission filter 6HT (second filter) and the reception filter 6HR (second filter), which have a pass band with a relatively high frequency, and the duplexer 60L configured by the transmission filter 6LT (first filter) and the reception filter 6LR (first filter), which have a pass band with a relatively low frequency. Further, the semiconductor control IC 40 is stacked with the duplexer 60L of the duplexer 60M configured by the transmission filter 6MT (second filter) and the reception filter 6MR (second filter), which have a pass band with a relatively high frequency, and the duplexer 60L configured by the transmission filter 6LT (third filter) and the reception filter 6LR (third filter), which have a pass band with a relatively low frequency.

Note that the semiconductor control IC 40 may be stacked with only one of the transmission filter 6LT and the reception filter 6LR instead of being stacked with the duplexer 60L. Similarly, in the following embodiment and modifications thereof, only one of the transmission filter and the reception filter configuring each duplexer may be arranged instead of arranging the duplexers 60L, 60M, and 60H.

When the transmission filter and the reception filter and the semiconductor control IC 40 are stacked, it is assumed that the control signal of the semiconductor control IC 40 is affected by the high-frequency noise oscillated from the transmission filter and the reception filter, and the switching performance of the switch and the amplification performance of the amplifier may be reduced. On the other hand, in the high-frequency module 1 according to the present embodiment, the semiconductor control IC 40 is stacked with the first filter among the second filter having a pass band with a relatively high frequency and the first filter having a pass band with a relatively low frequency. In other words, the semiconductor control IC 40 is not stacked with the second filter, but is stacked with the first filter. According to this configuration, the semiconductor control IC 40 is not stacked with the second filter that allows a signal, which easily propagates in the space and is likely to be a noise signal (having a high frequency), to pass therethrough, and is stacked with the first filter that allows a signal having a low frequency to pass therethrough. Therefore, it is possible to suppress the deterioration of the control characteristics of the semiconductor control IC 40 while reducing the size of the high-frequency module 1.

Note that in the high-frequency module 1 according to the present embodiment, the semiconductor control IC 40 is configured to be stacked with the duplexer 60L having the pass band with the lowest frequency out of three duplexers 60H, 60M, and 60L. However, the semiconductor control IC 40 may not be stacked with the duplexer 60H (transmission filter 6HT and reception filter 6HR: second filter) having a pass band with the highest frequency of the three duplexers 60H, 60M, and 60L, but may also be stacked with at least one of the duplexer 60M (transmission filter 6MT and reception filter 6MR: first filter) and the 60L (transmission filter 6LT and reception filter 6LR: third filter).

According to the above-described configuration, the semiconductor control IC 40 is not stacked with the second filter that allows a signal having the highest frequency to pass therethrough, and is stacked with the first filter or the third filter that has a pass band with a lower frequency than the pass band of the second filter. Therefore, since the semiconductor control IC 40 is not stacked with the second filter that passes a signal, which easily propagates in the space and is likely to be a noise signal (having the highest frequency), it is possible to suppress the deterioration of the control characteristics of the semiconductor control IC 40 while reducing the size of the high-frequency module 1.

Note that, as illustrated in FIG. 3, it is desirable that the duplexer 60L and the semiconductor control IC 40 be stacked in the order of the duplexer 60L and the semiconductor control IC 40 from the main surface of the mounting substrate 90.

According to the above-described configuration, since the high-frequency signal passing through the duplexer 60L transmits the mounting substrate 90, it is possible to suppress the propagation of the high-frequency signal to the semiconductor control IC 40 arranged on the side opposite to the mounting substrate 90 with respect to the duplexer 60L. Therefore, it is possible to further suppress the deterioration of the control characteristics of the semiconductor control IC 40.

In the high-frequency module 1 according to the present embodiment, in realizing a stacked structure illustrated in FIG. 3, the duplexers 60H, 60M, and 60L each are connected, via a bump electrode formed on lower surfaces thereof (surfaces on a negative side in the z-axis direction), to the mounting substrate 90. Further, the semiconductor control IC 40 is connected to the duplexer 60L via a bump electrode formed on a lower surface (a surface on the negative side in the z-axis direction) of the semiconductor control IC 40. In addition, the matching circuit 8MT (8MR) is connected to the duplexer 60M via a bump electrode formed on a lower surface (a surface on the negative side in the z-axis direction) of the matching circuit 8MT (8MR). In addition, the matching circuit 8HT (8HR) is connected to the duplexer 60H via a bump electrode formed on a lower surface (a surface on the negative side in the z-axis direction) of the matching circuit 8HT (8HR).

Note that, the bump electrode is a ball-shaped electrode made of a high-conductivity metal, and examples thereof include a solder bump made of Sn/Ag/Cu, a bump containing Au as a main component, and the like. Alternatively, instead of the bump electrode, an electrode formed of, for example, a solder paste may be used.

Note that in the present specification, in components such as the duplexer, the matching circuit, and the semiconductor control IC, among main surfaces thereof facing each other, a main surface that is close to the mounting substrate 90 is described as a lower surface, and a main surface that is far from the mounting substrate 90 is described as an upper surface.

Further, the semiconductor control IC 40 and the matching circuits 8HT (8HR) and 8MT (8MR) are each configured to transmit and receive, from the lower surfaces thereof, an electric signal to and from the duplexer and the mounting substrate 90, and be mechanically bonded to the duplexers on the lower surfaces thereof, but the present disclosure is not limited thereto. The semiconductor control IC 40 and the matching circuits 8HT (8HR) and 8MT (8MR) may be each configured to be mechanically bonded, on the lower surfaces thereof, to the duplexer via solder, an adhesive, or the like, and an electrode provided on upper surfaces thereof and an electrode provided on the main surface of the mounting substrate 90 may be connected by a bonding wire.

In addition, in the high-frequency module 1 according to the present embodiment, at least one of the matching circuits 8HT (8HR) and 8MT (8MR) is stacked with the second filter (duplexer 60H) among the second filter (duplexer 60H) having a pass band with a relatively high frequency and the first filter (duplexers 60M and 60L) having a pass band with a relatively low frequency. That is, the integrated passive element is stacked with the second filter among the second filter and the first filter.

According to the above configuration, the integrated passive element that is less affected by the high-frequency noise signal oscillated from the filter as compared with the semiconductor control IC 40 is stacked with the second filter. Therefore, it is possible to suppress the deterioration of the control characteristics of the semiconductor control IC 40 while reducing the size of the high-frequency module 1.

Note that, the integrated passive element stacked with the second filter is preferably at least one of the matching circuits 8HT, 8MT, 8LT, 8HR, 8MR, 8LR, and 80 (first integrated passive element) of the matching circuits 8HT, 8MT, 8LT, 8HR, 8MR, 8LR, and 80 (which are the first integrated passive elements) and the LC filter 61 (second integrated passive element).

According to the above-described configuration, of the matching circuits 8HT, 8MT, 8LT, 8HR, 8MR, 8LR, and 80 (which are the first integrated passive elements) and the LC filter 61 (second integrated passive element), the matching circuits 8HT, 8MT, 8LT, 8HR, 8MR, 8LR, and 80 (which are the first integrated passive elements), which are less affected by the high-frequency noise signal oscillated from the filter, are stacked with the second filter. Therefore, it is possible to suppress the deterioration of the control characteristics of the semiconductor control IC 40 while reducing the size of the high-frequency module 1.

Further, although not illustrated in FIG. 3, it is desirable that the LC filter 61 (second integrated passive element) be stacked with the first filter among the second filter having a pass band with a relatively high frequency and the first filter having a pass band with a relatively low frequency.

According to the above configuration, of the matching circuits 8HT, 8MT, 8LT, 8HR, 8MR, 8LR, and 80 (which are the first integrated passive elements) and the LC filter 61 (the second integrated passive element), the LC filter 61, which is likely to be affected by the high-frequency noise signal oscillated from the filter, is stacked with the first filter instead of the second filter. Therefore, it is possible to suppress the deterioration of the bandpass characteristics of the LC filter 61.

[3 Circuit Element Arrangement Configuration of High-Frequency Module 1A]

Figure 4:
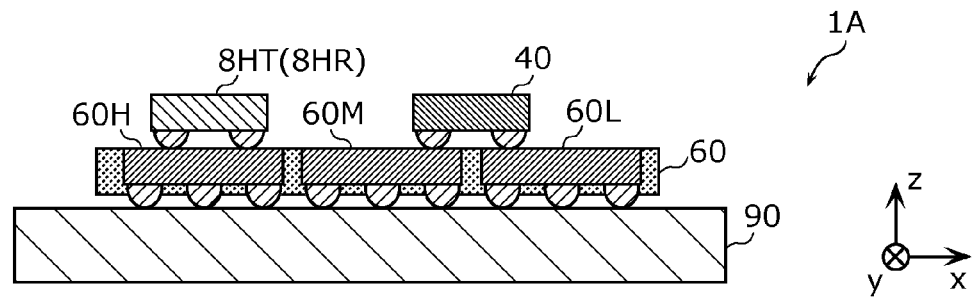
FIG. 4 is a schematic cross-sectional view of a high-frequency module according to Modification 1 of the embodiment.

FIG. 4 is a schematic cross-sectional view of a high-frequency module 1A according to Modification 1 of the embodiment. The arrangement configuration of the duplexer, the semiconductor control IC, and the matching circuit of the high-frequency module 1A illustrated in this figure differs from the high-frequency module 1 according to the embodiment. Hereinafter, a description of the same configuration of the high-frequency module 1A as that of the high-frequency module 1 according to the embodiment will be omitted, and different configurations will be mainly described.

As illustrated in FIG. 4, the duplexers 60H, 60M, and 60L are integrated to configure a duplexer module 60. The duplexer module 60 has a configuration in which the duplexers 60H, 60M, and 60L are formed into one chip, or a configuration in which the duplexers 60H, 60M, and 60L are incorporated in one package.

In addition, as illustrated in FIG. 4, the semiconductor control IC 40 and the matching circuit 8HT (8HR) are arranged above the duplexer module 60 (in a z-axis positive direction). The semiconductor control IC 40 and the duplexers 60M and 60L are stacked in a direction (z-axis direction) perpendicular to the main surface of the mounting substrate 90. Further, the duplexer 60H and the matching circuit 8HT (8HR) are stacked in a direction (z-axis direction) perpendicular to the main surface of the mounting substrate 90.

In the high-frequency module 1A according to the present modification, in realizing a stacked structure illustrated in FIG. 4, the duplexer module 60 is connected, via a bump electrode formed on a lower surface thereof, to the mounting substrate 90. Further, the semiconductor control IC 40 is connected, via a bump electrode formed on the lower surface thereof, to the duplexers 60M and 60L. In addition, the matching circuit 8HT (8HR) is connected, via a bump electrode formed on the lower surface thereof, to the duplexer 60H. Note that, instead of the bump electrode, an electrode formed of, for example, a solder paste may be used.

Further, the semiconductor control IC 40 and the matching circuit 8HT (8HR) are each configured to exchange, from the lower surfaces thereof, an electric signal with the duplexer and the mounting substrate 90, and be mechanically bonded to the duplexer on the lower surfaces thereof, but the present disclosure is not limited thereto. The semiconductor control IC 40 and the matching circuit 8HT (8HR) may be configured to be mechanically bonded, on the lower surfaces thereof, to the duplexer via solder or an adhesive, or the like, and an electrode provided on the upper surfaces thereof and the main surface of the mounting substrate 90 may be connected by a bonding wire.

Note that in the high-frequency module 1A according to the present modification, the semiconductor control IC 40 only needs to be stacked with at least one of the duplexers 60M and 60L, and at least one of the matching circuits 8HT, 8MT, 8LT, 8HR, 8MR, 8LR, and 80 and the LC filter 61 only needs to be stacked with the duplexer 60H.

According to the above configuration, the semiconductor control IC 40 is not stacked with the duplexer 60H (transmission filter 6HT and reception filter 6HR: second filter) that allows a signal, which easily propagates in the space and is likely to be a noise signal, to pass therethrough, of the duplexer module 60, and is stacked with at least one of the duplexers 60M (transmission filter 6MT and reception filter 6MR: first filter) and 60L (transmission filter 6LT and reception filter 6LR: first filter) that allow a signal having a low frequency to pass therethrough. Further, the matching circuit or the LC filter made by the integrated passive element is stacked with the duplexer 60H. Therefore, it is possible to suppress the deterioration of the control characteristics of the semiconductor control IC 40 while reducing the size of the high-frequency module 1A.

[4 Circuit Element Arrangement Configuration of High-Frequency Module 1B]

Figure 5:
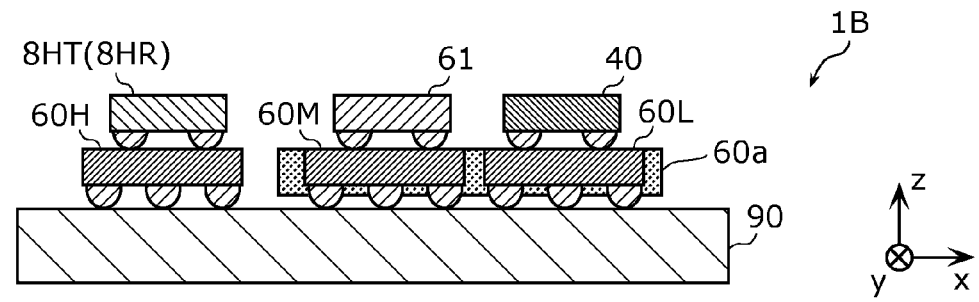
FIG. 5 is a schematic cross-sectional view of a high-frequency module according to Modification 2 of the embodiment.

FIG. 5 is a schematic cross-sectional view of a high-frequency module 1B according to Modification 2 of the embodiment. The arrangement configuration of the duplexer, the semiconductor control IC, the matching circuit, and the LC filter of the high-frequency module 1B illustrated in this figure differs from the high-frequency module 1A according to Modification 1. Hereinafter, a description of the same configuration of the high-frequency module 1B as that of the high-frequency module 1A according to Modification 1 will be omitted, and different configurations will be mainly described.

As illustrated in FIG. 5, the duplexers 60M and 60L are integrated to configure a duplexer 60a. The duplexer module 60a has a configuration in which the duplexers 60M and 60L are formed into one chip, or a configuration in which the duplexers 60M and 60L are incorporated in one package.

The semiconductor control IC 40 and the LC filter 61 are arranged above the duplexer module 60a (in the z-axis positive direction). The semiconductor control IC 40 and the duplexer 60L are stacked in a direction (z-axis direction) perpendicular to the main surface of the mounting substrate 90, and the LC filter (second integrated passive element) and the duplexer 60M (first filter) are stacked in a direction (z-axis direction) perpendicular to the main surface of the mounting substrate 90. Further, the duplexer 60H and the matching circuit 8HT (8HR) are stacked in a direction (z-axis direction) perpendicular to the main surface of the mounting substrate 90.

In the high-frequency module 1B according to the present modification, in realizing a stacked structure illustrated in FIG. 5, the duplexer module 60a and the duplexer 60H are each connected, via a bump electrode formed on lower surfaces thereof, to the mounting substrate 90. Further, the semiconductor control IC 40 is connected, via a bump electrode formed on the lower surface thereof, to the duplexer 60L. Further, the matching circuit 8HT (8HR) is connected, via a bump electrode formed on the lower surface thereof, to the duplexer 60H. Further, the LC filter 61 is connected, via a bump electrode formed on a lower surface thereof, to the duplexer 60M. Note that, instead of the bump electrode, an electrode formed of, for example, a solder paste may be used.

Further, the semiconductor control IC 40, the matching circuit 8HT (8HR), and the LC filter 61 are each configured to transmit and receive, from the lower surfaces thereof, an electric signal to and from the duplexer and the mounting substrate 90, and be mechanically bonded to the duplexer on the lower surface thereof, but the present disclosure is not limited thereto. The semiconductor control IC 40, the matching circuit 8HT (8HR), and the LC filter 61 may be each configured to be mechanically bonded, from the lower surfaces thereof, to the duplexer via solder, an adhesive, or the like, and an electrode provided on the upper surfaces thereof and the main surface of the mounting substrate 90 may be connected by a bonding wire.

Note that in the high-frequency module 1B according to the present modification, the semiconductor control IC 40 only needs to be stacked with one of the duplexers 60M and 60L, and the LC filter 61 only needs to be stacked with the other of the duplexers 60M and 60L. In addition, at least one of the matching circuits 8HT, 8MT, 8LT, 8HR, 8MR, 8LR, and 80 (first integrated passive element) only needs to be stacked with the duplexer 60H.

According to the above configuration, out of the duplexers 60H, 60M and 60L, the semiconductor control IC 40 is not stacked with the duplexer 60H that allows the signal, which easily propagates in the space and is likely to be a noise signal (having a high frequency), to pass therethrough, and is stacked with one of the duplexers 60M and 60L that allow a signal having a low frequency to pass therethrough. In addition, the matching circuit made of the first integrated passive element is stacked with the duplexer 60H. Therefore, it is possible to suppress the deterioration of the control characteristics of the semiconductor control IC 40 while reducing the size of the high-frequency module 1B.

Further, the LC filter 61 that is likely to be affected by the high-frequency noise signal oscillated from the duplexer is stacked with the other (first filter) of the duplexers 60M and 60L instead of the duplexer 60H (second filter). Therefore, it is possible to suppress the deterioration of the bandpass characteristics of the LC filter 61.

[5 Circuit Element Arrangement Configuration of High-Frequency Module 1C]

Figure 6:
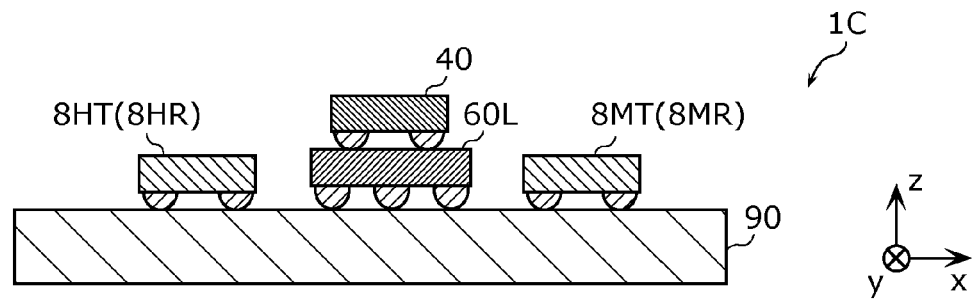
FIG. 6 is a schematic cross-sectional view of a high-frequency module according to Modification 3 of the embodiment.

FIG. 6 is a schematic cross-sectional view of a high-frequency module 1C according to Modification 3 of the embodiment. The high-frequency module 1C illustrated in this figure differs from the high-frequency module 1 according to the embodiment in the arrangement configuration of the duplexer, the semiconductor control IC, and the matching circuit. Hereinafter, a description of the same configuration of the high-frequency module 1C as that of the high-frequency module 1 according to the embodiment will be omitted, and different configurations will be mainly described.

As illustrated in FIG. 6, the semiconductor control IC 40 and the duplexer 60L are stacked in a direction (z-axis direction) perpendicular to the main surface of the mounting substrate 90. Further, the matching circuit 8HT (8HR) (third integrated passive element) and the matching circuit 8MT (8MR) (fourth integrated passive element) are mounted on the main surface of the mounting substrate 90.

In the high-frequency module 1C according to the present modification, in realizing a stacked structure illustrated in FIG. 6, the duplexer 60L and the matching circuits 8MT (8MR) and 8HT (8HR) are connected, via a bump electrode formed on the lower surfaces thereof, to the mounting substrate 90. Further, the semiconductor control IC 40 is connected, via a bump electrode formed on the lower surface thereof, to the duplexer 60L. Note that, instead of the bump electrode, an electrode formed of, for example, a solder paste may be used.

Further, the semiconductor control IC 40 is configured to transmit and receive, from the lower surface thereof, an electric signal to and from the duplexer 60L and the mounting substrate 90, and be mechanically bonded to the duplexer 60L on the lower surface thereof, but the present disclosure is not limited thereto. The semiconductor control IC 40 may be configured to be mechanically bonded, on the lower surface thereof, to the duplexer 60L via solder, an adhesive, or the like, and an electrode provided on the upper surface thereof and the main surface of the mounting substrate 90 may be connected by a bonding wire.

Here, when the mounting substrate 90 is seen in a plan view, a multilayer body of the semiconductor control IC 40 and the duplexer 60L is arranged between the matching circuit 8HT (8HR) (third integrated passive element) and the matching circuit 8MT (8MR) (fourth integrated passive element).

According to the above-described configuration, since the multilayer body is arranged between the matching circuit 8HT (8HR) and the matching circuit 8MT (8MR), it is possible to suppress electromagnetic field coupling between the matching circuit 8HT (8HR) and the matching circuit 8MT (8MR). Therefore, it is possible to suppress the coupling between a signal path for transmitting the high-frequency signal of the communication band A and a signal path for transmitting the high-frequency signal of the communication band B in a path that is not through the duplexer 60M or 60H. Therefore, it is possible to suppress the degradation of isolation between the high-frequency signals in the different communication bands.

Note that, in the high-frequency module 1C according to the present modification, a combination of the third integrated passive element and the fourth integrated passive element mounted on the main surface of the mounting substrate 90 only needs to be any two selected from the matching circuits 8HT, 8MT, 8LT, 8HR, 8MR, 8LR, and 80 and the LC filter 61.

[6 Circuit Element Arrangement Configuration of High-Frequency Module 1D]

Figure 7:
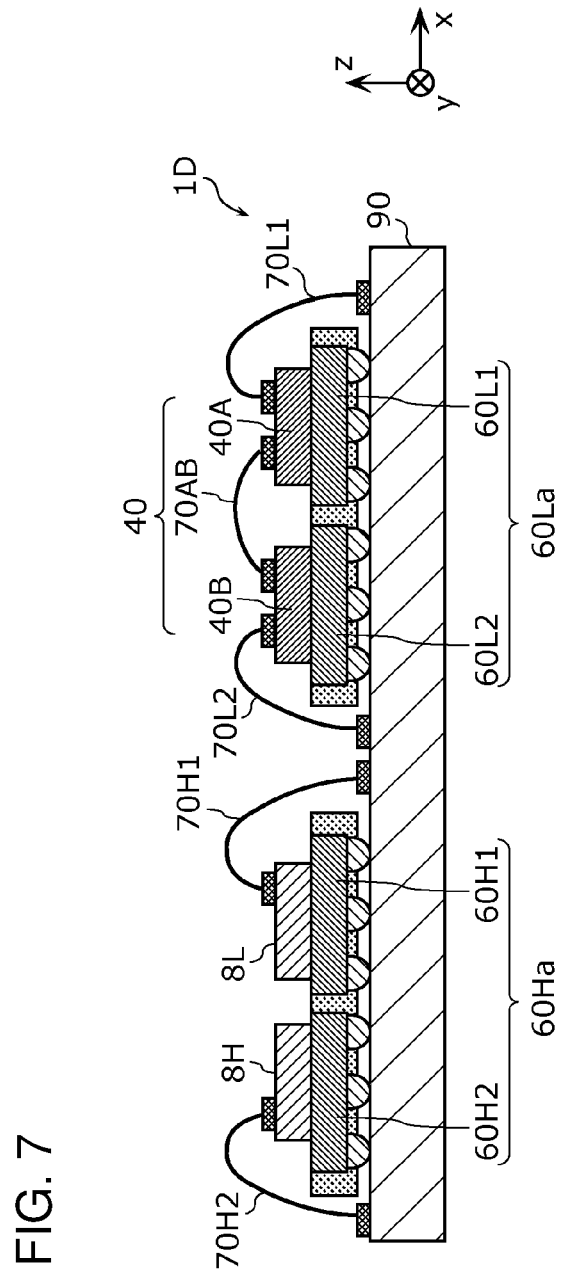
FIG. 7 is a schematic cross-sectional view of a high-frequency module according to Modification 4 of the embodiment.

FIG. 7 is a schematic cross-sectional view of a high-frequency module 1D according to Modification 4 of the embodiment. The high-frequency module 1D illustrated in this figure differs from the high-frequency module 1 according to the embodiment in the arrangement configuration of the duplexer, the semiconductor control IC, and the matching circuit. Hereinafter, description of the same configuration of the high-frequency module 1D as that of the high-frequency module 1 according to the embodiment will be omitted, and different configurations will be mainly described.

As illustrated in FIG. 7, duplexer modules 60Ha and 60La are mounted on the main surface of the mounting substrate 90. Further, semiconductor control ICs 40A and 40B are arranged above the duplexer module 60La (in the z-axis positive direction of). In addition, matching circuits 8H and 8L are arranged above the duplexer module 60Ha (in the z-axis positive direction).

The duplexer module 60La has duplexers 60L1 and 60L2, and each of the duplexers 60L1 and 60L2 includes a transmission filter and a reception filter. That is, the duplexer module 60La is a first filter assembly (first filter bank) in which a plurality of filter elements is integrated, and has a configuration in which the duplexers 60L1 and 60L2 are formed into one chip or a configuration in which the duplexers 60L1 and 60L2 are incorporated in one package.

The duplexer module 60Ha has duplexers 60H1 and 60H2, and each of duplexers 60H1 and 60H2 includes a transmission filter and a reception filter. That is, the duplexer module 60Ha is a second filter assembly (second filter bank) in which a plurality of filter elements is integrated, and has a configuration in which the duplexers 60H1 and 60H2 are formed into one chip or a configuration in which the duplexers 60H1 and 60H2 are incorporated in one package.

A pass band of each of the plurality of filter elements configuring the duplexer module 60La belongs to a first frequency band group. Further, the pass band of each of the plurality of filter elements configuring the duplexer module 60Ha belongs to a second frequency band group having a frequency higher than that of the first frequency band group. That is, the duplexer module 60La is a first filter made of a plurality of filter elements having a pass band with a low frequency. Further, the duplexer module 60Ha is a second filter made of a plurality of filter elements having a pass band with a high frequency.

The semiconductor control IC 40 is configured of the semiconductor control ICs 40A and 40B. The semiconductor control IC 40A is configured by, for example, one chip having the switch 10 and a part of the control circuit 30, and the semiconductor control IC 40B is configured by, for example, one chip having the low-noise amplifier and a part of the control circuit 30. Note that in the high-frequency module 1D according to the present modification, the semiconductor control IC 40 may not be configured by two chips of the semiconductor control ICs 40A and 40B, and may be collected on one chip.

The matching circuit 8H includes, for example, the matching circuits 8HT and 8HR illustrated in FIG. 1, and is a circuit that establishes impedance matching between the second filter having a pass band belonging to the second frequency band group and an amplifier for preferentially amplifying the high-frequency signal of the second frequency band group.

The matching circuit 8L includes, for example, the matching circuits 8LT and 8LR illustrated in FIG. 1, and is a circuit that establishes impedance matching between the first filter having a pass band belonging to the first frequency band group and an amplifier for preferentially amplifying the high-frequency signal of the first frequency band group.

The matching circuits 8H and 8L are each the first integrated passive element (first IPD) in which passive elements, such as an inductor and a capacitor, are integrated inside or on the surface of the substrate.

Here, the semiconductor control ICs 40A and 40B are stacked with the duplexer module 60La (first filter), and the matching circuits 8H and 8L are stacked with the duplexer module 60Ha (second filter).

In the high-frequency module 1D according to the present modification, in realizing a stacked structure illustrated in FIG. 7, the duplexer modules 60Ha and 60La are each connected, via a bump electrode formed on lower surfaces thereof, to the mounting substrate 90.

The semiconductor control IC 40A has a lower surface bonded to the duplexer module 60La via solder, an adhesive, or the like, and an upper surface connected to the main surface of the mounting substrate 90 by a bonding wire 70L1. Further, the semiconductor control IC 40B has a lower surface bonded to the duplexer module 60La via solder, an adhesive, or the like, and an upper surface connected to the main surface of the mounting substrate 90 by a bonding wire 70L2. Further, the upper surface of the semiconductor control IC 40A and the upper surface of the semiconductor control IC 40B are connected to each other by a bonding wire 70AB.

The matching circuit 8H has a lower surface bonded to the duplexer module 60Ha via solder, an adhesive, or the like and an upper surface connected to the main surface of the mounting substrate 90 by a bonding wire 70H2. Further, the matching circuit 8L has a lower surface bonded to the duplexer module 60Ha via solder, an adhesive, or the like, and an upper surface connected to the main surface of the mounting substrate 90 by a bonding wire 70H1.

The semiconductor control ICs 40A and 40B are connected to the mounting substrate 90 by the bonding wires 70L1 and 70L2, respectively, therefore, it is possible to suppress the interference received by the control signals outputted from the semiconductor control ICs 40A and 40B from the high-frequency signal transmitted through the duplexer module 60La.

Note that the semiconductor control ICs 40A and 40B and the matching circuits 8H and 8L may be each configured to be connected to the duplexer module and the mounting substrate 90 by forming a bump electrode on the lower surfaces thereof instead of being connected to the mounting substrate 90 via a bonding wire.

According to the above configuration, the semiconductor control IC 40 is not stacked with the duplexer module 60Ha (second filter, second filter assembly) that allows a signal, which easily propagates in the space and is likely to be a noise signal (having a high frequency), to pass therethrough, and is stacked with the duplexer module 60La (first filter, first filter assembly) that allows a signal having a low frequency to pass therethrough. Therefore, it is possible to suppress the deterioration of the control characteristics of the semiconductor control IC 40 while reducing the size of the high-frequency module 1D.

[7 Circuit Element Arrangement Configuration of High-Frequency Module 1E]

Figure 8:
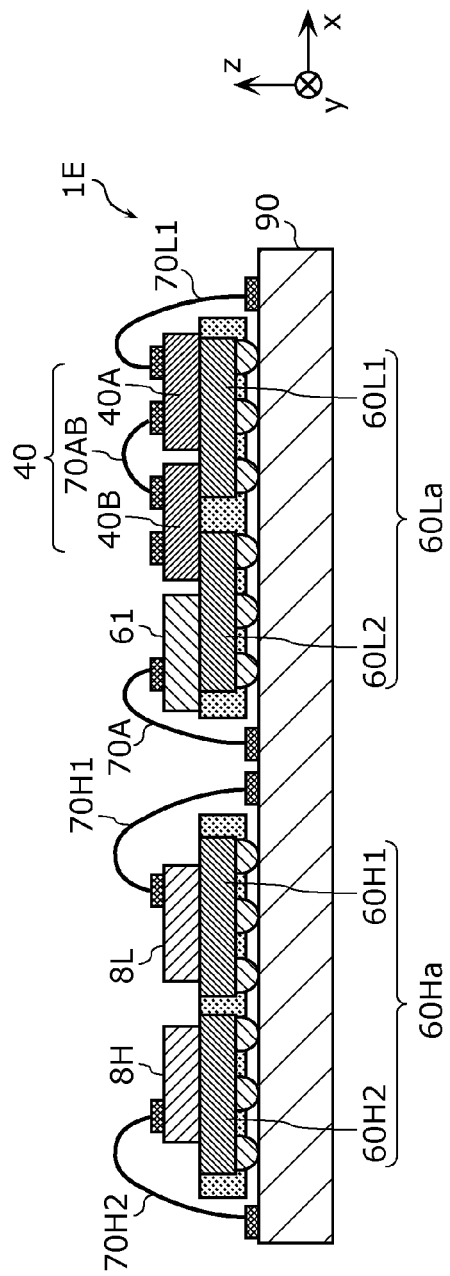
FIG. 8 is a schematic cross-sectional view of a high-frequency module according to Modification 5 of the embodiment.

FIG. 8 is a schematic cross-sectional view of a high-frequency module 1E according to Modification 5 of the embodiment. The high-frequency module 1E illustrated in this figure differs from the high-frequency module 1D according to Modification 4 in the arrangement configuration of the LC filter 61. Hereinafter, description of the same configuration of the high-frequency module 1E as that of the high-frequency module 1D according to Modification 4 will be omitted, and different configurations will be mainly described.

As illustrated in FIG. 8, the LC filter 61 (second IPD) and the semiconductor control ICs 40A and 40B are stacked with the duplexer module 60La (first filter, first filter assembly), and the matching circuits 8H and 8L (first IPD) are stacked with the duplexer module 60Ha (second filter, second filter assembly).

In the high-frequency module 1E according to the present modification, in realizing a stacked structure illustrated in FIG. 8, the LC filter 61 has a lower surface that is bonded to the duplexer module 60La via solder, an adhesive, or the like, and an upper surface that is connected to the main surface of the mounting substrate 90 by a bonding wire 70A.

Since the LC filter 61 is connected to the mounting substrate 90 by the bonding wire 70A, it is possible to suppress the interference received by the high-frequency signal passing through the LC filter 61 from the high-frequency signal transmitted through the duplexer module 60La.

Note that, instead of being connected to the mounting substrate 90 via the bonding wire 70A, the LC filter 61 may be configured to be connected to the duplexer module 60La and the mounting substrate 90 by forming a bump electrode on the lower surface of the LC filter 61.

According to the above configuration, the semiconductor control IC 40 is not stacked with the duplexer module 60Ha (second filter, second filter assembly) that allows a signal, which easily propagates in the space and is likely to be a noise signal (having a high frequency), to pass therethrough, and is stacked with the duplexer module 60La (first filter, first filter assembly) that allows a signal having a low frequency to pass therethrough. Therefore, it is possible to suppress the deterioration of the control characteristics of the semiconductor control IC 40 while reducing the size of the high-frequency module 1E.

Further, the LC filter 61 that is easily affected by the high-frequency noise signal oscillated from the duplexer is stacked with the duplexer module 60La (first filter, first filter assembly) instead of the duplexer module 60Ha (second filter, second filter assembly). Therefore, it is possible to suppress the deterioration of the bandpass characteristics of the LC filter 61.

OTHER EMBODIMENTS AND THE LIKE

Although the high-frequency module and the communication apparatus according to the present disclosure have been described above with reference to the embodiment and the modifications thereof, the high-frequency module and the communication apparatus according to the present disclosure are not limited to the above-described embodiment and modifications thereof. Another embodiment achieved by combining arbitrary constituent elements in the above-described embodiments and the modifications thereof, modifications obtained by applying various changes conceived by a person skilled in the art to the above-described embodiment and the modifications thereof without departing from the spirit of the present disclosure, and various devices incorporating the above-described high-frequency module and the communication apparatus are also included in the present disclosure.

For example, in the high-frequency module and the communication apparatus according to the above-described embodiment and the modifications thereof, another circuit element, wiring, and the like may be inserted between the circuit elements (and the components) and the paths connecting the signal paths disclosed in the drawings.

In addition, in the high-frequency module according to the embodiment and the modifications thereof, a resin member that covers at least part of the circuit elements (and the components) mounted on the mounting substrate 90 may further be arranged on the main surface of the mounting substrate 90. The resin member is, for example, a thermosetting epoxy resin, and may further contain an inorganic filler such as $SiO_2$.

The present disclosure is widely applicable to communication devices such as mobile phones and the like as a high-frequency module and a communication apparatus that are arranged in a multi-band compatible front-end unit.

1, 1A, 1B, 1C, 1D, 1E HIGH-FREQUENCY MODULE
2 ANTENNA
3 RF SIGNAL PROCESSING CIRCUIT (RFIC)
4 BASEBAND SIGNAL PROCESSING CIRCUIT (BBIC)
5 COMMUNICATION APPARATUS
6HR, 6LR, 6MR RECEPTION FILTER
6HT, 6LT, 6MT TRANSMISSION FILTER
7HR, 7LR, 7MR LOW-NOISE AMPLIFIER
7HT, 7LT, 7MT POWER AMPLIFIER
8H, 8HR, 8HT, 8L, 8LR, 8LT, 8MR, 8MT, 80 MATCHING CIRCUIT
10 SWITCH
30 CONTROL CIRCUIT
40, 40A, 40B SEMICONDUCTOR CONTROL IC
60, 60*a*, 60Ha, 60La DUPLEXER MODULE
60H, 60H1, 60H2, 60L, 60L1, 60L2, 60M DUPLEXER
61 LC FILTER
70A, 70AB, 70H1, 70H2, 70L1, 70L2 BONDING WIRE
90 MOUNTING SUBSTRATE
100 TRANSMISSION/RECEPTION TERMINAL

The invention claimed is:

1. A high-frequency module comprising:
a mounting substrate;
a first filter on the mounting substrate;
a second filter on the mounting substrate, the second filter having a pass band comprising higher frequencies than a pass band of the first filter; and
a semiconductor control integrated circuit (IC) on the mounting substrate,
wherein the semiconductor control IC is stacked with the first filter on the mounting substrate.

2. The high-frequency module according to claim 1, further comprising:
a third filter on the mounting substrate, the third filter having a pass band comprising a lower frequencies than the pass band of the second filter,
wherein the semiconductor control IC is stacked with at least the first filter on the mounting substrate, and is not stacked with the second filter on the mounting substrate.

3. The high-frequency module according to claim 2, wherein the semiconductor control IC is stacked with the first filter and the third filter on the mounting substrate, and is not stacked with the second filter on the mounting substrate.

4. The high-frequency module according to claim 1, wherein the semiconductor control IC is stacked on top of the first filter.

5. The high-frequency module according to claim 1, further comprising:
a first integrated passive circuit element,
wherein the first integrated passive circuit element is stacked with the second filter on the mounting substrate.

6. The high-frequency module according to claim 5, wherein the first integrated passive circuit element is configured to establish impedance matching between the first filter, the second filter, and the semiconductor control IC.

7. The high-frequency module according to claim 1, further comprising:
a second integrated passive circuit element stacked with the first filter on the mounting substrate,
wherein the second integrated passive circuit element comprises an inductor and or a capacitor that constitute at least part of an LC filter.

8. The high-frequency module according to claim 1, further comprising:
a third integrated passive circuit element and a fourth integrated passive circuit element,
wherein when the mounting substrate is viewed in a plan view, a multilayer body of the first filter and the semiconductor control IC are between the third integrated passive circuit element and the fourth integrated passive circuit element.

9. The high-frequency module according to claim 1,
wherein the first filter comprises a plurality of integrated filter circuit elements,
wherein the second filter comprises a plurality of integrated filter circuit elements,
wherein a pass band of each of the plurality of integrated filter circuit elements of the first filter belong to a first frequency band group, and
wherein a pass band of each of the plurality of filter circuit elements of the second filter belong to a second frequency band group, the second frequency band group having a higher frequency than the first frequency band group.

10. The high-frequency module according to claim 9, further comprising:
a first integrated passive circuit element; and
a second integrated passive circuit element,
wherein the first integrated passive circuit element is configured to establish impedance matching between the first filter, the second filter, and the semiconductor control IC,
wherein the second integrated passive circuit element comprises an inductor and or a capacitor that constitute at least part of an LC filter,
wherein the semiconductor control IC and the second integrated passive circuit element are stacked with the first filter on the mounting substrate, and
wherein the first integrated passive circuit element is stacked with the second filter on the mounting substrate.

11. The high-frequency module according to claim 1, wherein the semiconductor control IC comprises:
(1) a switch configured to selectively connect a transmission path for high-frequency signals, and a switch control circuit configured to control the switch; and/or
(2) an amplifier configured to amplify high-frequency signals, and an amplification control circuit configured to control a gain of the amplifier.

12. The high-frequency module according to claim 11, wherein the semiconductor control IC comprises the amplifier and the amplification control circuit, and
wherein the amplifier is a low-noise amplifier.

13. A communication apparatus comprising:
a radio frequency (RF) signal processing circuit configured to process high-frequency signals transmitted and received by an antenna; and
the high-frequency module according to claim 1, the high-frequency module being configured to pass the high-frequency signals between the antenna and the RF signal processing circuit.

* * * * *